(12) United States Patent
Koshikawa et al.

(10) Patent No.: US 9,041,169 B2
(45) Date of Patent: May 26, 2015

(54) SEMICONDUCTOR PACKAGING CONTAINER, SEMICONDUCTOR DEVICE, ELECTRONIC DEVICE

(71) Applicant: YOKOWO CO., LTD., Tokyo (JP)

(72) Inventors: Shoichi Koshikawa, Tokyo (JP); Junichiro Nikaido, Chuo (JP); Shintaro Takase, Sagamihara (JP); Yoshio Aoki, Kawasaki (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 14/287,926

(22) Filed: May 27, 2014

(65) Prior Publication Data

US 2014/0353811 A1   Dec. 4, 2014

(30) Foreign Application Priority Data

May 31, 2013   (JP) ................................. 2013-115537

(51) Int. Cl.
| H01L 23/34 | (2006.01) |
| H01L 29/06 | (2006.01) |
| H01L 23/055 | (2006.01) |
| H01L 23/10 | (2006.01) |

(52) U.S. Cl.
CPC .............. *H01L 23/055* (2013.01); *H01L 23/10* (2013.01)

(58) Field of Classification Search
CPC ...................................................... H01L 24/66
USPC ........... 257/664, 728, 704, E23.183, E23.191
See application file for complete search history.

(56) References Cited

U.S. PATENT DOCUMENTS

| 6,057,600 | A  | * | 5/2000  | Kitazawa et al. ............ 257/728 |
| 6,207,903 | B1 | * | 3/2001  | Wen et al. ................... 174/253 |
| 6,507,110 | B1 | * | 1/2003  | Chen ............................ 257/728 |
| 6,617,946 | B2 | * | 9/2003  | Kennedy et al. ............. 333/246 |
| 6,774,748 | B1 | * | 8/2004  | Ito et al. ...................... 333/247 |
| 7,004,325 | B2 |   | 2/2006  | Shoji |
| 7,170,373 | B2 | * | 1/2007  | Ito et al. ...................... 333/208 |
| 7,187,073 | B2 |   | 3/2007  | Shoji |
| 2003/0209465 | A1 |   | 11/2003 | Shoji |
| 2004/0173880 | A1 | * | 9/2004  | Achyut ....................... 257/664 |
| 2005/0253227 | A1 |   | 11/2005 | Shoji |
| 2006/0097388 | A1 | * | 5/2006  | Breitschwerdt et al. ..... 257/728 |
| 2006/0182386 | A1 | * | 8/2006  | Stenger ........................ 385/15 |
| 2014/0287701 | A1 | * | 9/2014  | Herbsommer et al. ...... 455/90.2 |

FOREIGN PATENT DOCUMENTS

| JP | 63152156 A | 6/1988 |
| JP | 01215049 A | 8/1989 |
| JP | 2002334944 A | 11/2002 |

\* cited by examiner

*Primary Examiner* — Nitin Parekh
(74) *Attorney, Agent, or Firm* — Matthew B. Dernier, Esq.; Gibson & Dernier LLP

(57) ABSTRACT

A semiconductor packaging container allowing to use in millimeter band is provided at a low cost. The inner SIG pads and the inner GND pads, capable of a direct connection with a signal terminal of a semiconductor chip 10 are provided on the bottomed cylindrical dielectric case formed of the liquid crystal polymer. Further, the external SIG pads integrally formed with the inner SIG pads 201, 202 and the external GND pad 303 integrally formed with the inner GND pad are provided on the back of the bottom surface of the dielectric case as the external terminal. The inner GND pads and are to form the coplanar waveguide with the inner SIG pads and. Also, the inner GND pads and are to add capacitive reactance for canceling the inductance caused by the space at the semiconductor chip portion to the coplanar waveguide.

9 Claims, 6 Drawing Sheets

SEMICONDUCTOR PACKAGING CONTAINER, SEMICONDUCTOR DEVICE, ELECTRONIC DEVICE

BACKGROUND OF THE INVENTION

1. Field of the Invention

The present invention relates to a semiconductor device, a semiconductor packaging container for implementing semiconductor chip and an electronic device used in a microwave band and a millimeter wave band.

2. Description of the Related Art

Among those semiconductor devices implementing a semiconductor circuit such as an integrated circuit (IC), a large scale integration (LSI) and the like and a semiconductor element such as diode (these are hereinafter referred to as "semiconductor chip"), for those used in a high frequency band, ceramics such as alumina or resin such as epoxy were used as matrix on a mounting substrate. The semiconductor chip is fixed to the mounting substrate with a conductive adhesive. Then, it is sealed with a resin with a gold (Au) wire for wiring. As the resin for sealing, an epoxy based thermosetting resin has been employed in the art.

When using ceramics on the mounting substrate, however, for those used in a high frequency band, it is difficult to make a fine processing. In addition, ceramics itself is so expensive that the cost for manufacturing the semiconductor device cannot be reduced. Further, when using the epoxy based thermosetting resin in the electronic device for a high frequency band such as a microwave band or a millimeter wave band, its relative dielectric constant and dielectric loss causes problems.

For example, for 1 [MHz] band, epoxy has a relative dielectric constant of about 3.8 and a dielectric loss of 0.016, whereas for 1 [GHz] band, epoxy has a relative dielectric constant of about 3.8 and the dielectric loss of 0.080. Therefore, when epoxy is used for the resin for sealing, characteristic impedance of the semiconductor device is changed in the micro wave band and in the millimeter wave band, which makes it impossible to obtain desired electrical characteristics.

From a viewpoint of packaging without influencing the electrical characteristics of the semiconductor chip, it is desirable to make a vacuum ambient environment when the semiconductor chip is mounted, since the relative dielectric constant of vacuum is 1 and the dielectric loss of vacuum is 0. Also, it is desirable to eliminate any reactance change when mounting the semiconductor chip. It is, however, difficult to realize such an ideal ambient environment. Therefore, in order to achieve an ambient as ideal as practical, it is desirable that a semiconductor device has a hollow structure in which resin for sealing is not filled around the semiconductor chip. Also, it is desirable that the semiconductor device is configured so as not to depend on a frequency.

Japanese Patent Laid-open Nos. 63-152156 and 01-215049 disclose a resin sealed semiconductor device having a hollow structure. In such semiconductor devices, packaging container is formed into hollow structure so that the problems in terms of the relative dielectric constant and the dielectric loss in a high frequency band are alleviated. In the semiconductor devices as disclosed in Japanese Patent Laid-open Nos. 63-152156 and 01-215049, however, the semiconductor chip is connected to an external circuit via lead. In such a structure, the inductance increases, due to the lead, in the higher frequency band. Therefore, in a high frequency band of 10 [GHz] or more, increased impedance of a transmission line causes a problem, i.e., the electrical characteristics such as reflection characteristics are deteriorated.

Further, according to a patent document 3 (Japanese Patent Laid-open No. 2002-334944), a semiconductor device having a hollow structure with the use of a resin substrate with shortened leads is disclosed. The semiconductor device as disclosed in the Japanese Patent Laid-open No. 2002-334944, however, is configured such that the leads passes through the inside of resin in the packaging container. This therefore leaves the problem that it is not suitable for use in the millimeter wave of 30 [MHz] or more.

LIST OF THE PRIOR ART DOCUMENTS

[Patent document 1] Japanese Patent Laid-open No. 63-152156

[Patent document 2] Japanese Patent Laid-open No. 01-215049

[Patent document 3] Japanese Patent Laid-open No. 2002-334944

In addition to the above-mentioned problems, the semiconductor devices disclosed in the patent documents 1, 2, and 3 have problem in that, due to a thickness of joining member used when mounting a semiconductor chip, the electrical characteristic is decreased. In particular, due to a variation in characteristic impedance of the transmission line, signal transmission characteristics are decreased.

When mounting a semiconductor chip on a substrate, in case of flip-chip, for example, a semiconductor chip is joined to a predetermined part with a joining member such as conductive adhesive. Then, the semiconductor chip is arranged at a position higher by the thickness of the joining member, which generates a space between the semiconductor chip and a base substrate. If there is a space or void in the mounted part, the surface of the semiconductor chip is covered by air layer so that it is not influenced by a peripheral material lossless transmission line is formed. However, as the frequency becomes high, the conductor on the semiconductor chip will behave as inductance. Therefore, the characteristic impedance as the transmission line becomes large so that over a certain frequency, good transmission characteristic cannot be obtained. On the other hand, in order to reduce parasitic capacitance, some space around the semiconductor chip is necessary. Therefore, it is necessary to suppress impedance variation while keeping some space.

The main problem of the present invention is to provide a semiconductor packaging container which enables to reduce manufacturing cost and which has a structure allowing the semiconductor chip to be mounted to be used in a high frequency wave band such as millimeter wave band. The other problem of the present invention is to provide a semiconductor device with improved signal transmission characteristics in a high frequency band and to provide an electronic device using such semiconductor device.

SUMMARY OF THE INVENTION

According to the present disclosure, the semiconductor packaging container has a bottomed cylindrical dielectric case including dielectric except for ceramics, wherein a first signal conductor and a first grounding conductor are provided on a bottom surface of the dielectric case, the first conductor being capable of a direct bonding with a signal terminal of a semiconductor chip, the first grounding conductor forming a coplanar waveguide with the first signal conductor. One first grounding conductor is provided adjacent to the first signal conductor. Alternatively, a pair of the first grounding conductors may be provided to sandwich the first signal conductor in between. Further, a second signal conductor is provided at a position corresponding to the first signal conductor on the back of the bottom surface of the dielectric case. Also, a second grounding conductor is provided at a position corresponding to the first grounding conductor on the back of the bottom surface of the dielectric case.

An electrical continuity is established between the first signal conductor and the second signal conductor through a via which passes through the bottom surface of the dielectric case. Likewise, an electrical continuity is established between the first grounding conductor and the second grounding conductor through a via which passes through the bottom surface of the dielectric case.

The hole is a through hole or a via hole whose inside is covered by the conductor. The dielectric case is, for example, comprised of polyimide or liquid crystal polymer.

Further, according to the semiconductor device of the present disclosure, the semiconductor chip is mounted on the above-mentioned semiconductor packaging device and the peripheral space of the semiconductor chip is sealed with the dielectric lid. A plurality of semiconductor chips can be mounted on one semiconductor packaging container. According to the electronic device of the present disclosure, a plurality of above-mentioned semiconductor devices are provided and electrical continuity is established between the second signal conductors and between the second grounding conductors respectively through surface bonding.

Further features of the present invention will become apparent from the following description of exemplary embodiments (with reference to the attached drawings).

DESCRIPTION OF THE EMBODIMENTS

Figure 1:
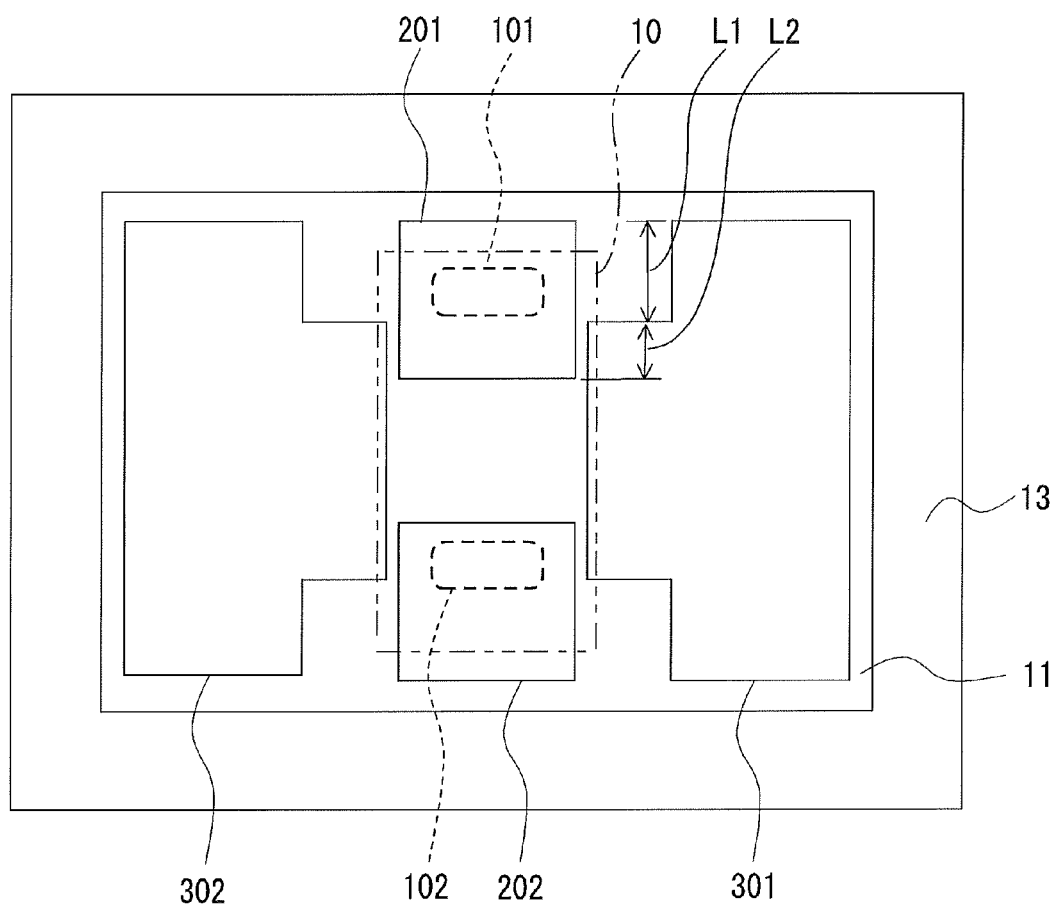
FIG. 1 is a top view illustrating an example of an internal structure of a semiconductor packaging container according to a present embodiment.
Figure 2:
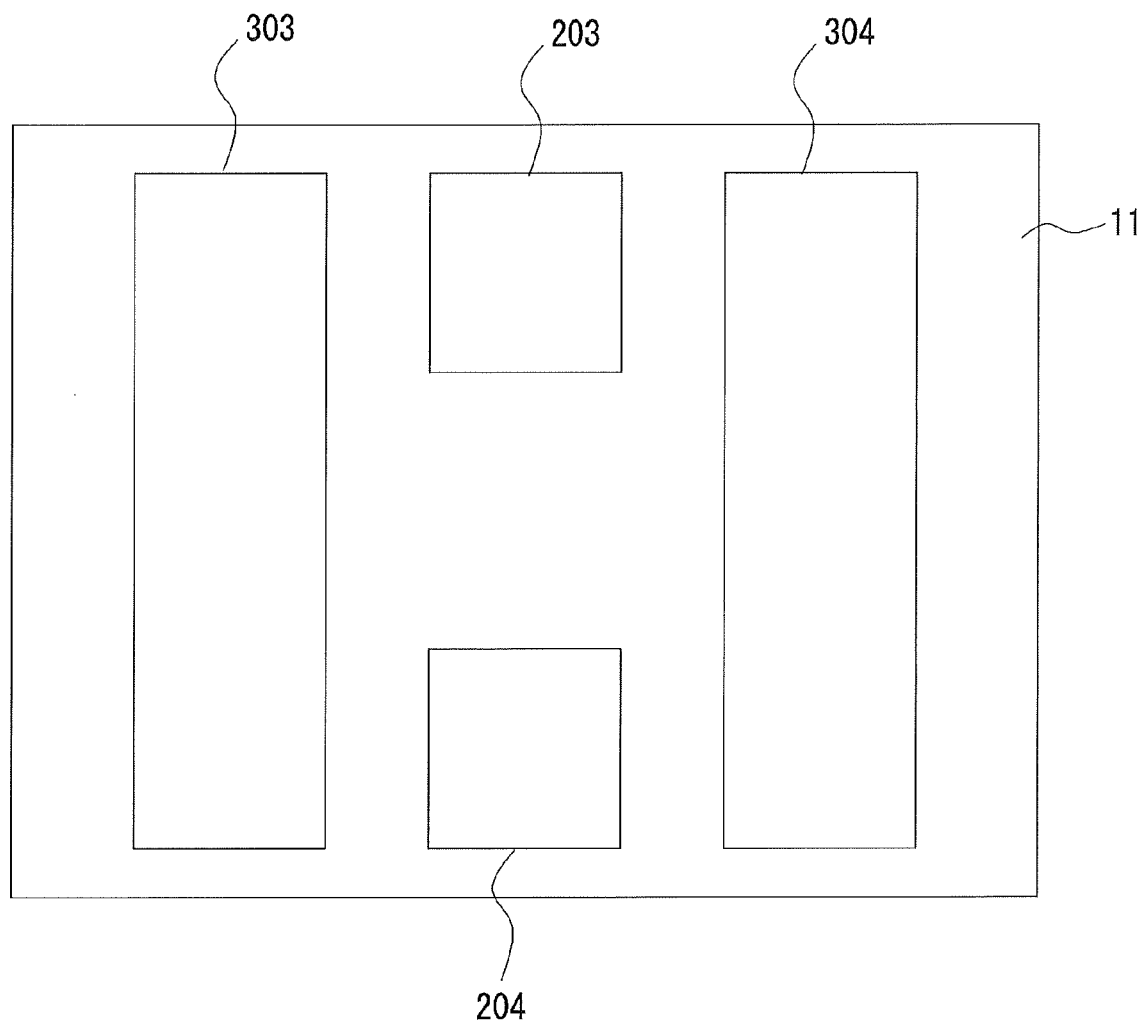
FIG. 2 is a back view of a semiconductor packaging device according to the present embodiment.
Figure 3:
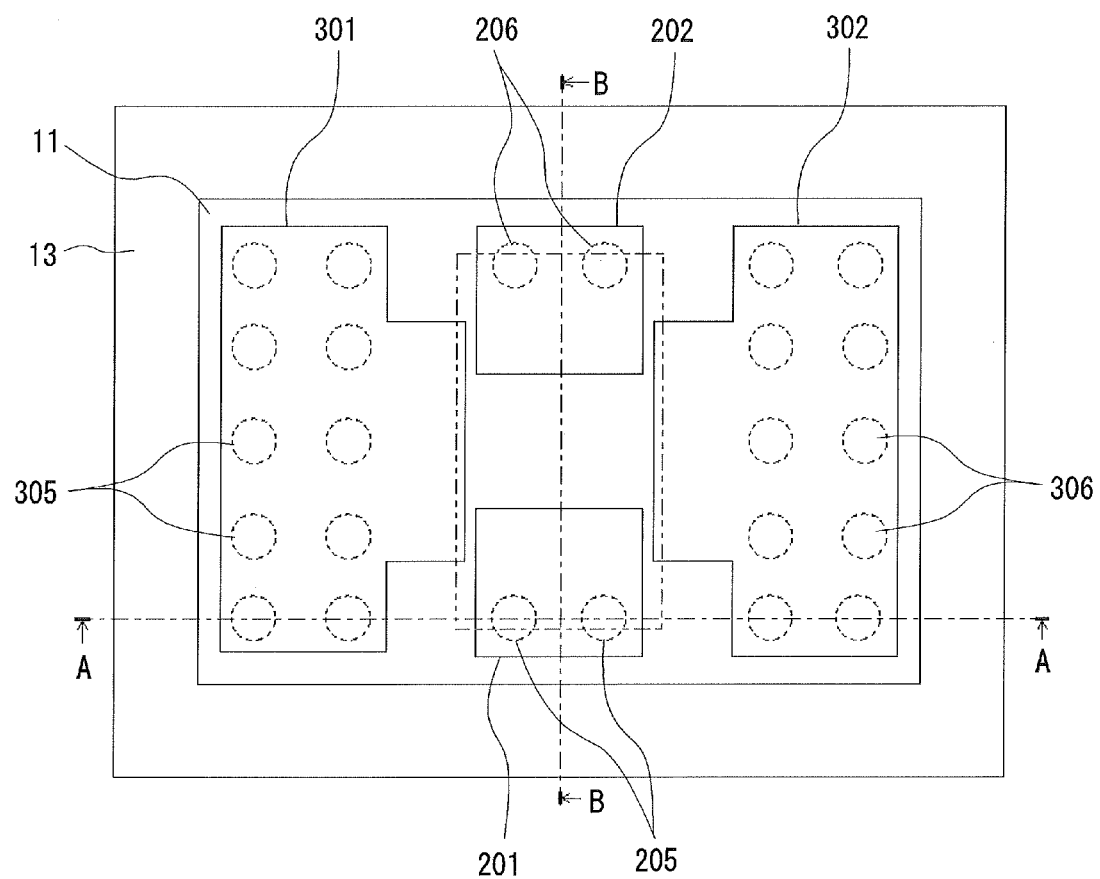
FIG. 3 is an explanatory diagram illustrating positions of via holes in a semiconductor packaging device according to the present embodiment.

The embodiment of the present disclosure will be described with reference to the accompanied drawings. FIG. 1 is a top view illustrating an example of an internal structure of semiconductor packaging container according to the present embodiment. FIG. 2 is a back view of the semiconductor packaging device. FIG. 3 is an explanatory diagram illustrating positions of via holes formed in the semiconductor packaging device.

In the semiconductor packaging container, the semiconductor chip used in a high frequency band is mounted on positions shown by broken line in FIG. 1. Description is made in a case where, in the present embodiment, the semiconductor chip is unidirectional element having two signal terminals.

The semiconductor packaging container according to the present embodiment can be formed by using dielectric excluding ceramics such as alumina. For example, the semiconductor packaging container can be formed by using liquid crystal polymer. Liquid crystal polymer has relative dielectric constant of about 3 and dielectric loss of 0.002 in 10 GHz band. Therefore, even in a frequency band of 10 GHz or more, the loss of the liquid crystal polymer is relatively low. Adding this, compared to the ceramics, fine processing of liquid crystal polymer is easily performed. Therefore, in order to obtain required electrical characteristics, liquid crystal polymer can be processed at a remarkably low price compared to the ceramics.

The semiconductor packaging container can be manufactured as follows. As shown in FIG. 1, a base substrate 11, containing liquid crystal polymer as main material, is prepared. The base substrate 11 has a long side size of 1.6 [mm] and a short side size of 1.2 [mm]. The thickness of the base substrate 11 is 0.025 [mm]. A laminated substrate 13 is bonded to the outer periphery of the surface of the base substrate 11 with a high heat resistance adhesive 12. The laminated substrate 13 is also formed, containing liquid crystal polymer as main material.

The dielectric case is constituted by the base substrate 11 and the laminated substrate 13 in this way. The dielectric case forms a bottomed cylindrical shape. An area of the base substrate 11 except for an outer periphery, to which the laminated substrate 13 is bonded, forms the bottom surface of the dielectric case. The term "bottomed cylindrical shape" represents a rectangular cylinder, a cylinder or a shape similar to these and a part opposing to the bottom surface is open. The inner wall of the bottomed cylindrical dielectric case is not necessarily be a rectangular, however, when a rectangular shape as shown is used, the long side size is 1.3 [mm] and the short side size is 0.9 [mm].

After manufacturing the bottomed cylindrical dielectric case as above, or before bonding the laminated substrate on the base substrate 11, a coplanar waveguide is provided on the bottom surface of the dielectric case (in case of the base substrate 11, a surface corresponding to the bottom surface).

The coplanar waveguide is a waveguide configured such that a grounding conductor(s) is positioned on both sides or one side of the signal conductor, which transmits an electromagnetic wave by an electric field directed from the signal conductor to the grounding conductor and a magnetic field in a direction surrounding the periphery of the signal conductor.

In the present embodiment, two inner SIG pads (first signal conductor) 201 and 202 are positioned in parallel in the waveguide direction of the coplanar waveguide, the two inner SIG pads 201 and 202 having surface bonded with the signal terminals 101 and 102 of the semiconductor chip 10 subject to be mounted. As shown, when rectangular inner SIG pads 201 and 202 are used, its long side size is 0.3 [mm]. The short side size depends on how many inner SIG pads are positioned. When two inner SIG pads are arranged, the short side size is somewhat shorter than the long side size.

Further, projection parts of a pair of the convexed inner GND pads (first grounding conductor) 301, 302 are respectively positioned to oppose to the inner SIG pads 201 and 202. The convexed inner GND pads 301 and 302 are symmetrically positioned so as to sandwich the inner SIG pads 201 and 202 in between.

Each of the inner GND pads 301 and 302 includes edges opposing to and adjacent to the inner SIG pads 201 and 202 (first edges, shown as L1 in FIG. 1) and edges opposing to and not adjacent to the inner SIG pads 201 and 202 (second edges, shown as L2 in FIG. 1). The inner SIG pads 201 and 202 are positioned to oppose to the inner GND pads 301 and 302 to have a predetermined space between inner SIG pads 201 and 202 and the above-mentioned respective first edges.

The predetermined space is 0.02 [mm]. Excluding the projection part (convex part), the inner GND pads (first grounding conductor) 301 and 302 have the long side size of 0.76 [mm], the short side size of 0.3 [mm] and the projection size of the projection part of 0.14 [mm].

The first edges (shown as L2 in FIG. 1) of the inner GND pads (first grounding conductor) 301 and 302 are formed shorter than the second edges (shown as L1 in FIG. 1) of the inner GND pads 301 and 302.

The reason for employing this construction will be described later. A coplanar waveguide is formed by the inner SIG pads 201 and 202 and a pair of the inner GND pads 301 and 302. Note that the inner SIG pads 201 and 202 and the inner GND pads (first grounding conductor) 301 and 302 are pad-like conductor each having the same thickness.

The shape and the size of the inner GND pads 301 and 302 can be changed in accordance with the shape and the size of the semiconductor chip 10 being mounted. Since the purpose for providing the inner GND pads 301 and 302 is to cancel the inductance generated when mounting the semiconductor chip 10, the shape and the size of the inner GND pads 301 and 302 can be changed. In particular, to add capacitive reactance to the coplanar waveguide depending on the space between the external GND pads 301 and 302 and the inner SIG pads 201 and 202. The amount of the capacitive reactance being added changes depending on the state of the semiconductor chip when mounted. The detail of this construction will be described later.

Further, as shown in FIG. 2, an external SIG pad (second signal conductor) 203 is provided on a position corresponding to the inner SIG pad 201 on the back of the bottom surface of the dielectric case, i.e., on the backside of the base substrate 11. Likewise, an external SIG pad (second signal conductor) 204 is provided on a position corresponding to the inner SIG pad 202 on the backside of the base substrate 11.

Further, an external GND pad (second grounding conductor) 303 is provided on a corresponding area with respect to the inner GND pad 301. Also, an external GND pad (second grounding conductor) 304 is provided on a corresponding area with respect to the inner GND pad 302. Note that "corresponding area" does not necessarily mean an area symmetrical to, with respect to the base substrate, the inner GND pad 301 or the inner GND pad 302. An area overlapping, with the base substrate 11 being sandwiched, a part of the inner GND pad 301 or the inner GND pad 302 can be "corresponding area".

In other words, it is not necessary that the external SIG pads and the external GND pads respectively are provided at positions symmetrical to the inner SIG pads and the inner GND pads respectively sandwiching the base substrate 11 in between. Instead, the external SIG pads and the external GND pads respectively may be provided so as to overlap a part of the inner SIG pads and the inner GND pads respectively sandwiching the base substrate 11 in between. The inner SIG pads 201 and 201, the inner GND pads 301 and 302, the external SIG pads 203 and 204, and the external GND pads 303 and 304 respectively are film body, containing copper (Cu) as main material.

Then, the inner SIG pad 201 and the external SIG pad 203 are electrically conducted through via holes 205 as shown in FIG. 3. Similarly, the inner SIG pad 202 and the external SIG pad 204 are electrically conducted through via holes 206, the inner GND pad 301 and the external GND pad 303 through via holes 305, and the inner GND pad 302 and the external GND pad 304 through via holes 306. The inside of each via hole 205, 206, 305 and 306, which passes through the base substrate 11, is formed of conductor material, and the conductor material acts as known VIA electrode.

Note that the through holes may be previously punched on the base substrate 11. Then, when forming the inner SIG pads 201 and 202, the external SIG pads 203 and 204 may integrally be formed by the conductor which goes around via the through holes. The same applies to the inner GND pads 301 and 302. The through holes may be previously punched on the base substrate 11. Then, when forming the inner GND pads 301 and 302, the external GND pads 303 and 304 may integrally be formed by the conductor which goes around via the through holes. By this way, it is possible to avoid deterioration of the electrical characteristics of the semiconductor chip 10 caused by impedance mismatching when conducting between pads.

In this way, a semiconductor packaging container having the coplanar waveguide can be manufactured, the coplanar waveguide provided on the bottom surface and back of the dielectric case with the conductor being exposed. The external SIG pads 203 and 204 and the external GND pads 303 and 304 can be used as the external terminal of the semiconductor packaging container.

When mounting the semiconductor chip 10 to the semiconductor packaging container, the signal terminal 101 of the semiconductor chip 10 and the inner SIG pad 201 are surface-bonded by soldering. Similarly, the signal terminal 102 of the semiconductor chip 10 and the inner SIG pad 202 are surface-bonded by soldering. This enables bonding of the terminal and corresponding pad with minimum distance. Then, the upper edge of the laminated substrate 13 and the dielectric lid 15 are bonded with a high heat resistance adhesive 14. This seals the peripheral space of the semiconductor chip 10 including above-mentioned space with the dielectric lid 15. Note that, instead of solder bonding, flip-chip mounted bonding method can be used. The flip-chip mounted bonding method is a method for electrically bonding one terminal and the other terminal by protruded terminals arranged in array, which is called bump.

Figure 4:
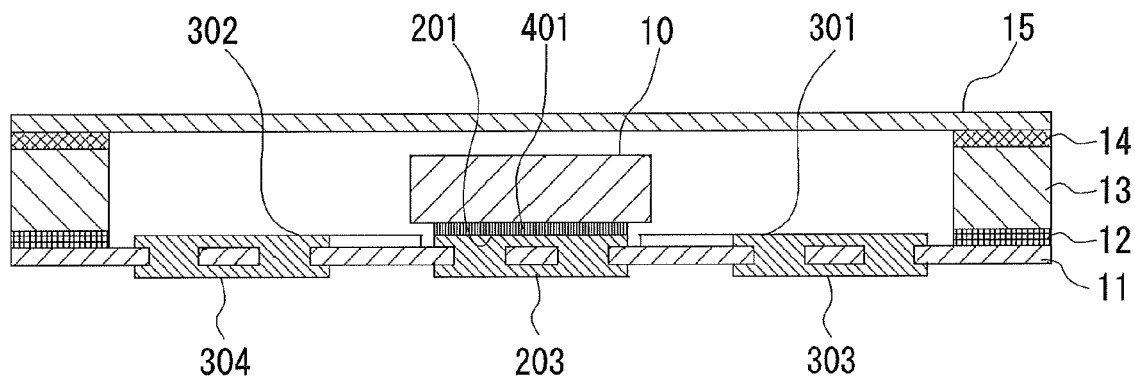
FIG. 4 is a sectional view along line A-A of FIG. 3, showing a state where semiconductor chip is mounted and an opening of a dielectric case is covered with a dielectric lid.
Figure 5:
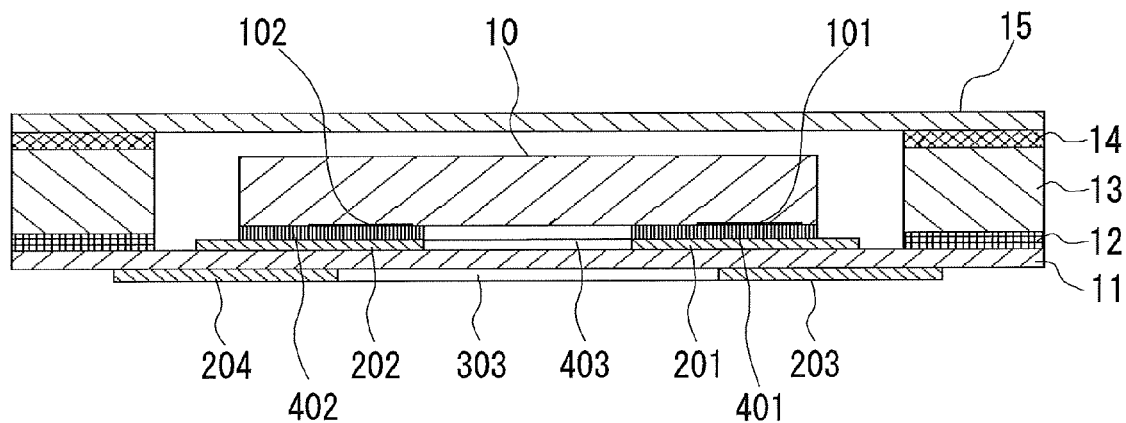
FIG. 5 is a sectional view along line B-B of FIG. 3, showing a state where semiconductor chip is mounted and an opening of a dielectric case is covered with a dielectric lid.

FIG. 4 is a sectional view along line A-A of FIG. 3, showing a state where the semiconductor chip 10 is mounted and an opening of the dielectric case is covered with a dielectric lid 15 and FIG. 5 is a sectional view along line B-B thereof. It means that each of FIG. 4 and FIG. 5 respectively illustrates a side sectional structure of the semiconductor device in which the semiconductor chip 10 is mounted on the semiconductor packaging container. FIG. 4 is an example illustrating a case where the inner SIG pad 201 and the external SIG pad 203, the inner GND pad 301 and the external GND pad 303, the inner GND pad 302 and the external GND pad 304 are integrally formed respectively. Further, FIG. 4 and FIG. 5 illustrate that the rectangular frame-shaped laminated substrate 13 is bonded to the outer circumference of the base substrate 11 with the high heat resistance adhesive 12 so that the bottomed cylindrical dielectric case is formed. The part except for where the laminated substrate 13 is bonded becomes a bottom surface of the dielectric case. Further, FIG. 4 and FIG. 5 illustrate that the semiconductor chip 10 is surface-bonded on the inner SIG pads 201 and 202 through the solder layers 401 and 402. They also show that the dielectric lid 15 is bonded on the upper end surface of the laminated substrate 13 with the high heat resistance adhesive 14. The height from the back of the base substrate 11 to the upper surface of the dielectric lid 15 is 0.5 [mm].

In FIG. 5, a space 403 is illustrated. The space 403 is defined as a space, on the surface opposing to the base substrate 11, between the surface not opposing to the two inner SIG pads 201 and 202 and the surface of the base substrate 11 opposing to the two inner SIG pads 201 and 202. The semiconductor chip is positioned at a position higher by the thickness from the surface of the base substrate 11 to the inner SIG pads 201 and 202 as well as the thickness of the solder layers 401 and 402. As a result, when the part on the semiconductor chip 10 opposing to the base substrate 11 is regarded as a transmission line, the characteristic impedance is increased on the part at which the semiconductor chip is mounted. Therefore, similar to the conventional packaging container, the available frequency domain is limited to low frequency. This is because, in a high frequency such as in millimeter wave band, the space 403, which enlarges depending on the thickness of the solder layers 401 and 402 and the thickness of the inner SIG pads 201 and 202, works as an inductance added in series to the transmission line existing in the semiconductor chip 10.

On the other hand, in order to reduce the parasitic capacitance of the semiconductor chip 10, space is necessary. Therefore, it is required to suppress the increase of the characteristic impedance while keeping the space.

In this embodiment, in order to cancel the inductance, the inner GND pads 301 and 302 are provided. It means that, it is provided such that capacitive reactance is connected in parallel with respect to the inductance. Therefore, the increase of the characteristic impedance can be suppressed so that it becomes possible to prevent phenomenon in which available frequency domain is limited to low frequency resulting from mounting of the semiconductor chip 10.

Further, parts of the tip of the projection part of the inner GND pads 301 and 302 are opposed to the inner SIG pads 201 and 202. For example, in case of the inner GND pad 301, the edge opposing to and adjacent to the inner SIG pad 201 (L2 in FIG. 1) is formed shorter than the edge opposing to and not adjacent to the inner SIG pad 201 (L1 in FIG. 1).

This is to widen a broadband of available frequency according to the degree of the capacitance of the opposing part and the capacitance by the end effect between the pad edges.

This enables to flexibly adapt according to the shape and size of the semiconductor chip 10 being mounted.

Figure 6:
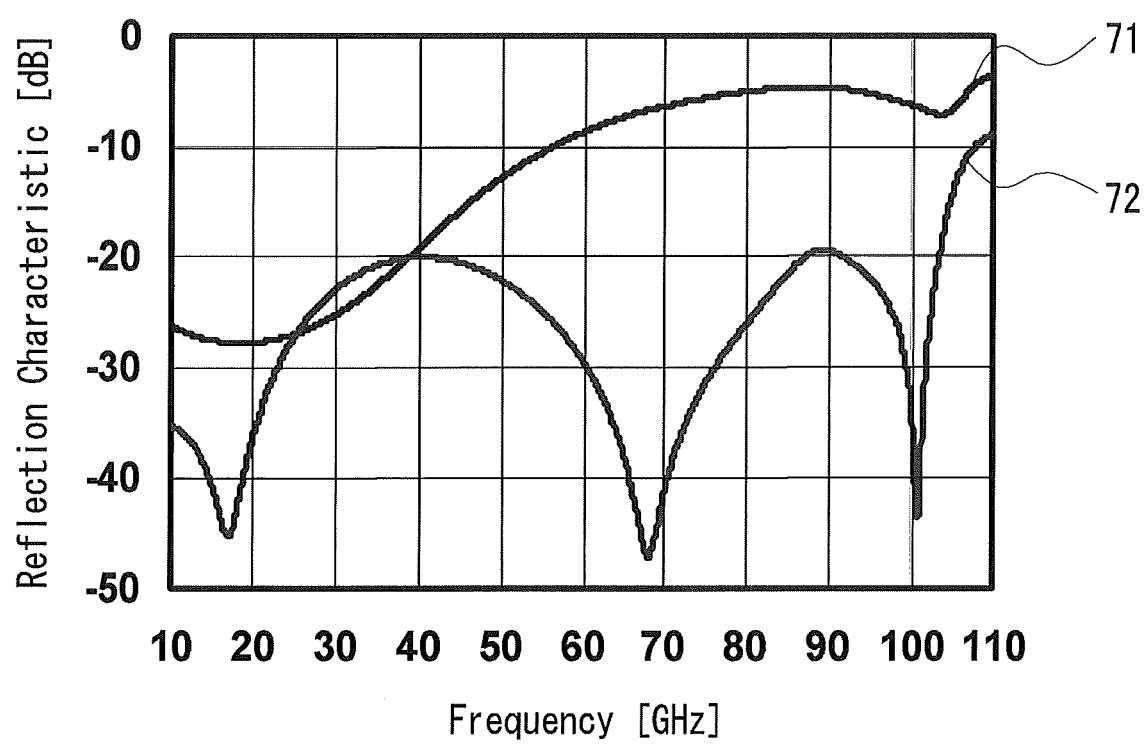
FIG. 6 is a graph showing used frequency and reflection characteristic in cases where inner GND pad is used and inner GND pad is not used.

The inventors of the present invention simulated differences in a case where the inner GND pads 301 and 302 are provided and not provided on the bottom surface of the semiconductor packaging container of the present embodiment. FIG. 6 is a graph showing the result. In FIG. 6, the vertical axis of the graph shows reflection characteristic [dB] and the lateral axis of the graph shows frequency [GHz]. The smaller reflection characteristic [dB] (the larger negative numeric value) shows that the reflection of a signal component is small. In FIG. 6, the reflection characteristic 72 of the lower graph shows a case where the inner GND pads 301 and 302 are provided.

The reflection characteristic 71 of the upper graph shows a case where the inner GND pads 301 and 302 are not provided.

Referring to FIG. 6, in a case where the inner GND pads 301 and 302 are provided, the frequency domain with the reflection characteristics of less than −15 dB is extended to the extent of 105 GHz. On the contrary, in a case where the inner GND pads 301 and 302 are not provided, the frequency at which reflection characteristics of a practical level is obtained is up to 40 GHz. As mentioned, it is found that, in order to widen a broadband of available frequency, the capacitive reactance added by the inner GND pads 301 and 302 is extremely effective.

As above, in the present embodiment, the bottomed cylindrical dielectric case made of the liquid crystal polymer is formed and the upper end surface of the laminated substrate 13 is bonded to the dielectric lid 15 with the high heat resistance adhesive 14 so that it is possible to realize the semiconductor packaging container having the hollow structure without the use of resin for sealing.

Further, the liquid crystal polymer is used as a main material so that even in a frequency band of 10 GHz or more, it is possible to manufacture the low loss semiconductor packaging container. Further, compared to the ceramics, fine processing is easily performed to the liquid crystal polymer, which enables to manufacture the semiconductor packaging container at a remarkably low price.

Further, since lead wire is not used for wiring with the semiconductor chip 10, it is not necessary to consider any influence of inductance in a high frequency band.

Further, since the capacitive reactance is added by the inner GND pads 301 and 302, the influence from the thickness of the inner SIG pads 201 and 202 and the solder layers 401 and 402 and from the size of the space 403 are alleviated. Therefore, it is possible to realize the semiconductor packaging container which keeps good reflection characteristics to over 100 GHz.

Further, the external SIG pads 203, 204 and the external GND pads 303, 304 can be used as external terminal. Therefore, signals etc., can be supplied to, or obtained from, the mounted semiconductor chip 10 at the backside of the semiconductor packaging container, as a result, it is easily mounted on an electronic device.

This enables to manufacture a semiconductor device which has excellent signal transmission characteristics and which can easily be incorporated into the electronic devices at low cost.

In the semiconductor device, the signal terminal of the semiconductor chip 10 and the inner SIG pads 201 and 202 are directly bonded by soldering or flip-chip mounting. Therefore, the semiconductor chip can be mounted without using any adhesives. This simplifies the manufacturing process.

Note that, in the present embodiment, description was made in a case where unidirectional element having two signal terminals is used as the semiconductor chip 10, however, the semiconductor chip having one signal terminal or the semiconductor chip having three or more signal terminals may be mounted. Further, the semiconductor package container may be multi-tip module type which can mount a plurality of semiconductor chips in one semiconductor packaging container. In these cases, a plurality of the inner SIG pads may be provided at respective positions at which the distance therebetween is minimized. When providing more than three inner SIG pads, they can be positioned in line in waveguide direction of the coplanar waveguide.

Further, in the present embodiment, description was made in a case where the coplanar waveguide is formed by a pair of the inner GND pads 301 and 302, however, the coplanar waveguide may be formed with one inner GND pad and two external GND pads. Alternatively, one external GND pad may only be used.

Further, in the present embodiment, the dielectric case and the dielectric lid 15 of the semiconductor packaging container are made of the liquid crystal polymer. Alternatively, the dielectric case and the dielectric lid 15 may be made of polyimide. The polyimide has relative dielectric constant of about 3.2 and dielectric loss of 0.005 at 14.5 [GHz] band. Fine processing of polyimide is easily performed, which enables to obtain the similar effect when liquid crystal polymer is used.

Figure 7:
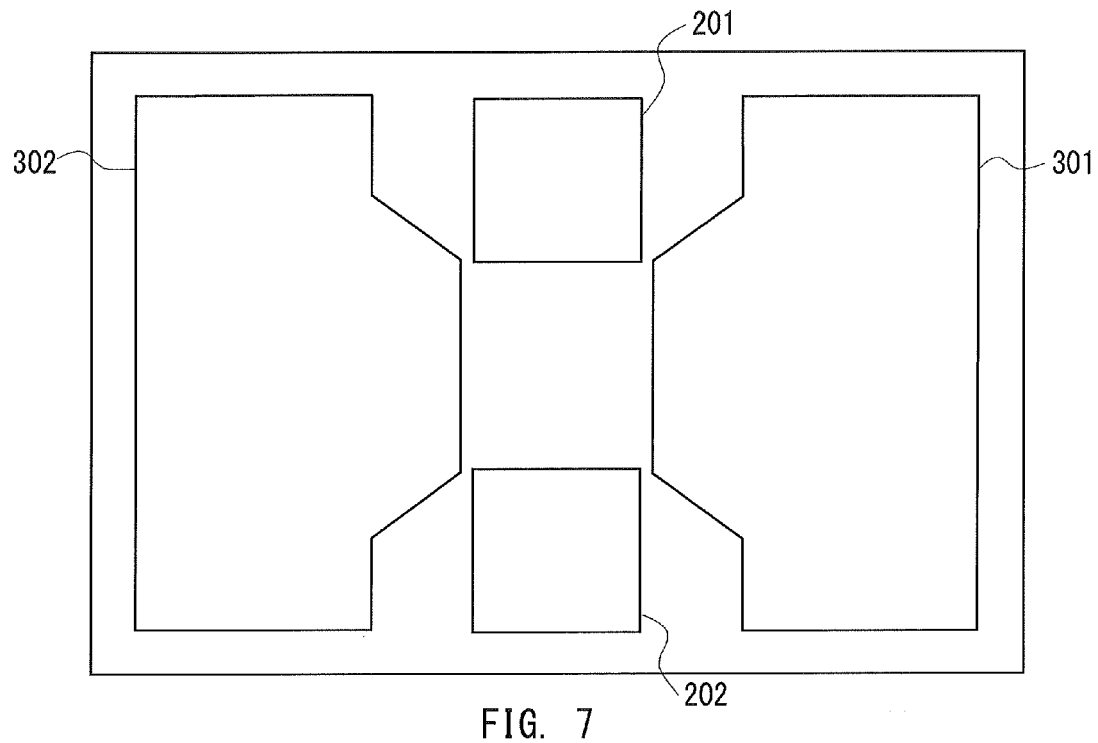
FIG. 7 illustrates a variation of inner GND pad.
Figure 8:
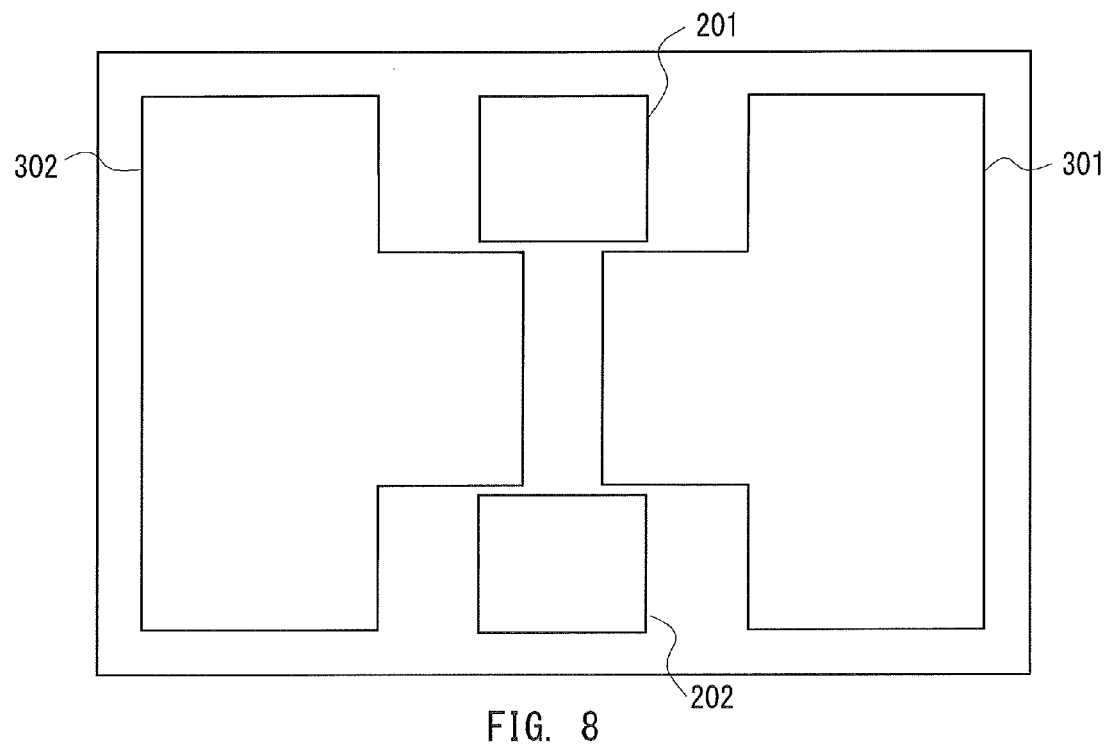
FIG. 8 illustrates a variation of inner GND pad.

Further, in the present embodiment, description was made in a case where the inner GND pads 301 and 302 are formed into convex. As mentioned, the inner GND pads 301 and 302 may be formed in such a manner that the edges opposing to and adjacent to the inner SIG pads 201 and 202 are formed shorter than the edges opposing to and not adjacent to the inner SIG pads 201 and 202. Therefore, the inner GND pads 301 and 302 may be formed into trapezoid, as shown in FIG. 7. Further, in a case where the conductor width on the semiconductor chip is narrow, as shown in FIG. 8, the tip of the convex part may be in an opposing region between the two inner SIG pads 201 and 202.

The semiconductor packaging container of the present disclosure has a bottomed cylindrical dielectric case. Therefore, by covering its opening, the periphery of the semiconductor chip can easily be formed into a hollow structure. Further, wiring can be performed by simply making a surface bonding of the signal terminal of the semiconductor chip with the signal conductor provided on the bottom surface of the semiconductor packaging container, which makes it easy to mount the semiconductor chip.

Further, the provision of coplanar waveguide on the bottom surface enables to obtain good electrical characteristics such as transmission characteristics over a wide band.

Further, the conductor (such as electrode) used in the semiconductor packaging container is positioned on the backside of the bottom surface through a hole such as a via hole. Therefore, the conductor can be used as a connection terminal to an external circuit. This enables to realize the semiconductor device which is easily mounted on a substrate and which is capable of maintaining good electrical characteristics over a wide band.

INDUSTRIAL APPLICABILITY

The present disclosure is applicable as a semiconductor device or a semiconductor packaging container used for wireless terminal device, base station apparatus, wireless measurement apparatus, and radar apparatus. The feature of the present invention result in a major contribution in manufacturing less expensive and highly reliable wireless terminal device, base station apparatus, wireless measurement apparatus, and radar apparatus.

What is claimed is:

1. A semiconductor packaging container comprising a bottomed cylindrical dielectric case including a dielectric substrate disposed on a dielectric base substrate that does not include ceramics, comprising:
    a first signal conductor and a first grounding conductor provided on a bottom surface of the dielectric case, the first signal conductor being capable of a direct connection with a signal terminal of a semiconductor chip, and the first grounding conductor forming a coplanar waveguide with the first signal conductor, and
    a second signal conductor provided at a position corresponding to the first signal conductor on a back of the bottom surface of the dielectric case, and a second grounding conductor provided at a position corresponding to the first grounding conductor on the back of the bottom surface of the dielectric case,
    wherein an electrical continuity is established between the first signal conductor and the second signal conductor through a via which passes through the bottom surface of the dielectric case and an electrical continuity is established between the first grounding conductor and the second grounding conductor through a via which passes through the bottom surface of the dielectric case, the vias passing directly from a top surface to the bottom surface thereof, and wherein the first grounding conductor is formed in such a manner that an edge opposing to and adjacent to the first signal conductor is shorter than an edge opposing to and not adjacent to the first signal conductor.

2. The semiconductor packaging container according to claim 1,
    wherein the first signal conductor and the second signal conductor are integrally formed through the corresponding via, further, the first grounding conductor and the second grounding conductor are integrally formed through the corresponding via.

3. The semiconductor packaging container according to claim 1, wherein a plurality of the first signal conductors are provided in a waveguide direction of the coplanar waveguide.

4. The semiconductor packaging container according to claim 3, wherein the semiconductor chip comprises a plurality of signal terminals;
    and a plurality of the first signal conductor are provided at positions at which the distance between the first signal conductor and the corresponding signal terminal of the semiconductor chip is minimized.

5. The semiconductor packaging container according to claim 1, wherein the dielectric case is made of polyimide or liquid crystal polymer.

6. A semiconductor device comprising a bottomed cylindrical dielectric case and a dielectric lid disposed thereon, each including dielectric that does not include ceramics, comprising;
    a first signal conductor and a first grounding conductor provided on a bottom surface of the dielectric case, the first conductor is connected with a signal terminal of a semiconductor chip, and the first grounding conductor forming a coplanar waveguide with the first signal conductor, and
    a second signal conductor provided at a position corresponding to the first signal conductor on the back of the bottom surface of the case, and a second grounding conductor provided at a position corresponding to the first grounding conductor on the back of the bottom surface of the dielectric case,
    wherein an electrical continuity is respectively established between the first signal conductor and the second signal conductor and between the first grounding conductor and the second grounding conductor through respective vias which passes through the bottom surface of the dielectric case, the vias passing directly from a top surface to the bottom surface thereof, and wherein the first grounding conductor is formed in such a manner that an edge opposing to and adjacent to the first signal conductor is shorter than an edge opposing to and not adjacent to the first signal conductor, and
    wherein peripheral space of the semiconductor chip is sealed with the dielectric lid.

7. The semiconductor device according to claim 6, wherein the first signal conductor and signal terminal of the semiconductor chip are bonded by soldering or flip-chip.

8. The semiconductor device according to claim 6, wherein the dielectric case or the dielectric lid are made of polyimide or liquid crystal polymer.

9. An electronic device comprising of a plurality of semiconductor devices according to claim 6, wherein electrical continuity is respectively established between the second signal conductors and between the second grounding conductors of each semiconductor device through surface-bonding.

* * * * *

UNITED STATES PATENT AND TRADEMARK OFFICE
CERTIFICATE OF CORRECTION

PATENT NO. : 9,041,169 B2
APPLICATION NO. : 14/287926
DATED : May 26, 2015
INVENTOR(S) : Shiochi Koshikawa et al.

It is certified that error appears in the above-identified patent and that said Letters Patent is hereby corrected as shown below:

In the Claims

Column 9, Claim 1, Line 53: Delete "bottom surface" and insert --top surface of a bottom portion--;

Column 9, Claim 1, Line 59: Delete "back of the";

Column 9, Claim 1, Line 60: after "bottom surface of", insert --the bottom portion of--;

Column 9, Claim 1, Line 62: Delete "the back of";

Column 9, Claim 1, Line 63: after "the", insert --bottom portion of the--;

Column 10, Claim 6, Line 36: Delete "bottom surface" and insert --top surface of a bottom portion--;

Column 10, Claim 6, Line 37: after "first", insert --signal--;

Column 10, Claim 6, Line 42: Delete "the back of the" and insert --a--;

Column 10, Claim 6, Line 43: after "of", insert --the bottom portion of--;

Column 10, Claim 6, Line 45: Delete "the back of";

Column 10, Claim 6, Line 46: after "the", insert --bottom portion of the--; and

Column 10, Claim 6, Line 57: after "to", insert --, and farthest from,--.

Signed and Sealed this
Twenty-ninth Day of September, 2015

Michelle K. Lee
*Director of the United States Patent and Trademark Office*